(12) United States Patent
Chidurala et al.

(10) Patent No.: US 11,031,913 B2
(45) Date of Patent: Jun. 8, 2021

(54) BIAS VOLTAGE CONNECTIONS IN RF POWER AMPLIFIER PACKAGING

(71) Applicant: Cree, Inc., Durham, NC (US)

(72) Inventors: Madhu Chidurala, Los Altos, CA (US); Marvin Marbell, Morgan Hill, CA (US); Simon Ward, Morgan Hill, CA (US)

(73) Assignee: Cree, Inc., Durham, NC (US)

( * ) Notice: Subject to any disclaimer, the term of this patent is extended or adjusted under 35 U.S.C. 154(b) by 34 days.

(21) Appl. No.: 16/414,955

(22) Filed: May 17, 2019

(65) Prior Publication Data

US 2020/0366249 A1 Nov. 19, 2020

(51) Int. Cl.
| | |
|---|---|
| *H03F 1/10* | (2006.01) |
| *H03F 1/02* | (2006.01) |
| *H03F 1/56* | (2006.01) |
| *H03F 3/213* | (2006.01) |

(52) U.S. Cl.
CPC .......... *H03F 1/0288* (2013.01); *H03F 1/565* (2013.01); *H03F 3/213* (2013.01); *H03F 2200/222* (2013.01); *H03F 2200/267* (2013.01); *H03F 2200/387* (2013.01); *H03F 2200/451* (2013.01)

(58) Field of Classification Search
CPC . H03F 1/08; H03F 1/083; H03F 1/086; H03F 1/10; H03F 3/195
USPC ................................ 330/65, 66, 67, 68, 307
See application file for complete search history.

(56) References Cited

U.S. PATENT DOCUMENTS

| | | | |
|---|---|---|---|
| 6,734,728 B1 | 5/2004 | Leighton et al. | |
| 7,990,223 B1* | 8/2011 | Takagi | .................... H03F 3/195 330/307 |
| 2018/0145023 A1 | 5/2018 | Hasegawa et al. | |
| 2019/0140598 A1 | 5/2019 | Schultz et al. | |

* cited by examiner

*Primary Examiner* — Steven J Mottola
(74) *Attorney, Agent, or Firm* — Coats & Bennett, PLLC

(57) ABSTRACT

In integrating RF power amplifier circuits on a package, at least one bias voltage is coupled to at least one amplifier circuit on the package via two or more pins/connectors. In particular, at least one of a gate and drain bias voltage is coupled to one or more amplifier circuits via at least two pins/connectors. In some embodiments, the two or more bias voltage pins/connectors are connected together on the package, placing the pins/connectors in parallel, which reduces an inductance associated with the pins/connectors. In some embodiments, at least of the two pins/connectors connected to the same bias voltage are disposed on either side of an RF signal pin/conductor, simplifying the routing of signals on the package, affording greater flexibility of placement and routing on the package.

23 Claims, 12 Drawing Sheets

7500-030/P2890US1
100

```
┌─────────────────────────────────────────────────────────────┐
│  PLACE A FIRST AMPLIFIER CIRCUIT HAVING SOURCE, GATE, AND   │
│  DRAIN TERMINALS ON THE PACKAGE, AND CONNECT THE SOURCE     │
│             TERMINAL TO RF SIGNAL GROUND                    │
│                          102                                │
└─────────────────────────────────────────────────────────────┘
                              │
                              ▼
┌─────────────────────────────────────────────────────────────┐
│    CONNECT A FIRST RF INPUT CONNECTOR TO THE FIRST          │
│              AMPLIFIER CIRCUIT GATE TERMINAL                │
│                          104                                │
└─────────────────────────────────────────────────────────────┘
                              │
                              ▼
┌─────────────────────────────────────────────────────────────┐
│    CONNECT A FIRST RF OUTPUT CONNECTOR TO THE FIRST         │
│             AMPLIFIER CIRCUIT DRAIN TERMINAL                │
│                          106                                │
└─────────────────────────────────────────────────────────────┘
                              │
                              ▼
┌─────────────────────────────────────────────────────────────┐
│    COUPLE A FIRST GATE BIAS VOLTAGE CONNECTOR TO THE GATE   │
│              TERMINAL OF THE FIRST AMPLIFIER CIRCUIT        │
│                          108                                │
└─────────────────────────────────────────────────────────────┘
                              │
                              ▼
┌─────────────────────────────────────────────────────────────┐
│  COUPLE A FIRST DRAIN BIAS VOLTAGE CONNECTOR TO THE DRAIN   │
│            TERMINAL OF THE FIRST AMPLIFIER CIRCUIT          │
│                          110                                │
└─────────────────────────────────────────────────────────────┘
                              │
                        AT LEAST ONE OF
                   ┌──────────┴──────────┐
                   ▼                     ▼
┌────────────────────────────┐  ┌────────────────────────────┐
│ CONNECT A SECOND GATE BIAS │  │ CONNECT A SECOND DRAIN BIAS│
│ VOLTAGE CONNECTOR TO THE   │  │ VOLTAGE CONNECTOR TO THE   │
│ FIRST GATE BIAS VOLTAGE    │  │ FIRST DRAIN BIAS VOLTAGE   │
│        CONNECTOR           │  │        CONNECTOR           │
│            112             │  │            114             │
└────────────────────────────┘  └────────────────────────────┘
```

Figure 13

BIAS VOLTAGE CONNECTIONS IN RF POWER AMPLIFIER PACKAGING

FIELD OF INVENTION

The present invention relates generally to RF power amplifier circuits, and in particular to a system and method of supplying bias voltages to amplifier circuits on a package by connecting two or more pins/connectors to the same bias voltage.

BACKGROUND

Modern wireless communication networks operate by transmitting voice and data content modulated onto Radio Frequency (RF) signals, generally between fixed access points (known as base stations, eNB, gNB, etc.) and a large number of mobile terminals (User Equipment or UE, tablets, laptops, etc.). Signal transmissions in both directions require RF power amplifiers. Efficiency (output power divided by input power) is an important consideration in both cases. Efficient power amplifiers are desired at access points because inefficient amplifiers simply turn much of the power consumed into heat, raising operating costs and requiring physical designs to discharge the heat. The power amplifier in a mobile terminal is a major consumer of battery power, and high efficiency is desired to extend the useful device lifetime per charge.

Amplifiers operate most efficiently at or near compression—the point at which an amplifier is always ON, or strongly conducting. An amplifier operating below its compression point operates in a linear range—the output signal is an amplified version of the input signal. Amplifiers that operate partially or totally in compression can transmit frequency/phase modulated signals, or On-Off Keying modulated signals (e.g., Morse code), at high power with high efficiency. In these applications, linearity is not required—that is, the amplifier may distort the signal amplitude without affecting the information modulated onto the signal. However, communication signals that encode information, even in part, by modulating the amplitude of a carrier signal require power amplifiers to operate with high linearity, to preserve the AM information.

Many of the signal modulation schemes standardized for use in modern wireless communication networks, such as for example, the various levels of Quadrature Amplitude Modulation (16-QAM, 64-QAM, 256-QAM), require a linear amplifier to avoid loss of amplitude-modulated information that would occur if the amplifier ran in compression. A characteristic of many such signals is that the average signal power is relatively low, but intermittent peaks in the signal have high power, compared to the average. This characteristic is quantified as the Peak to Average Power Ratio (PAPR). A single power amplifier transmitting a high-PAPR signal exhibits low efficiency, as it must be sized for signal peaks, which occur infrequently, and on average it runs at very low power. That is, the power amplifier must be designed with a large "headroom" that, on average, is not used. Since the operating point of the amplifier is far below its compression point, efficiency is poor. This means much of the power it consumes (from a battery in the case of a mobile terminal) is wasted as heat.

William Doherty solved this problem in 1936, designing a power amplifier having improved efficiency while transmitting high-PAPR AM radio signals. A Doherty amplifier 10, represented in block diagram form in FIG. 1, comprises a first amplifier 18a used for most signal amplification, often referred to as a "main" or "carrier" amplifier, and a second amplifier 18b used to amplify signal peaks, often referred to as an "auxiliary" or "peak" amplifier. The more general terms "first" and "second" amplifier are used herein. A class AB amplifier is often used for the first amplifier 18a, which can be biased to amplify the average signal within a linear range, but close to compression (i.e., with low headroom). Signal peaks are amplified by, e.g., a class C amplifier as the second amplifier 18b, which is inactive most of the time, and only needs to be linear over a small portion of the input signal conduction angle. The operation of a transistor as a class AB or C amplifier is established by the bias voltages applied to the gate and drain terminals.

A feature of the Doherty amplifier is the output connection of the first 18a and second 18b amplifiers, which is made through an impedance inverter 22, often implemented using a quarter-wavelength transmission line, and having a 90-degree phase shift. At low input signal power levels, the second amplifier 18b is inactive, and the impedance inverter 22 presents a high output impedance to the first amplifier 18a, improving its efficiency. As the second amplifier 18b begins to amplify signal peaks, its output current increases the voltage across the load impedance, which the impedance inverter 22 presents to the first amplifier 18a as a decreasing impedance, allowing its output power to increase as the input signal power increases. This is known as load-modulation, and it results in the Doherty amplifier 10 exhibiting high efficiency across the full range of input signal power.

Referring to FIG. 1, a power divider circuit 12 divides an RF input signal between the first 18a and second 18b amplifiers in response to its instantaneous power level. A phase shifter 14 delays the phase of the second amplifier 18b input by 90 degrees, to match the 90-degree delay which the output impedance inverter 22 applies to the output of the first amplifier 18a. In some embodiments, the power divider 12 and phase shifter 14 may be combined in a quadrature power divider, which both splits the input signal and applies a 90-degree phase shift to the second amplifier 18b input. Input RF impedance matching circuits 16a, 16b perform impedance matching, e.g., matching a standard 50Ω system impedance to the low input impedances of the first 18a and second 18b amplifiers. Similarly, output RF impedance matching circuits 20a, 20b match the output impedance of the first 18a and second 18b amplifiers to the load impedance $Z_{load}$ seen by the amplifiers 18a, 18b. This output impedance matching is one way to improve the bandwidth of the Doherty amplifier 10.

As described above, the outputs of the first 18a and second 18b amplifiers in a Doherty configuration are connected by an impedance inverter 22 having a 90-degree phase delay. The impedance inverter 22 is often implemented using a quarter-wavelength transmission line. The output of the Doherty amplifier 10 is taken at a so-called summing node, typically on the second amplifier 18b side of the impedance inverter 22. An output impedance matching circuit (OMN) 24, such as an impedance transformer, matches the load impedance $Z_{load}$ to the standard 50Ω system impedance.

FIG. 2 is a simplified circuit model of a Doherty amplifier 10, in which the first 18a and second 18b amplifiers are modeled as ideal current sources. The impedance inverter 22 is a quarter-wave transmission line, with a 90-degree phase shift. The combined output power is taken from the summing node, and the load is represented by a resistor $R_{sum}$. The input power divider 12, phase shifter 14, and input 16 and output 20 impedance matching circuits are omitted for clarity.

Real-world RF power amplifiers 18a, 18b, such as Laterally Diffused Metal Oxide Semi-conductor (LDMOS) or Gallium Nitride (GaN) HEMT devices, generate distortion across the required bandwidth, especially in the video frequencies, such as around 100 MHz. One known approach to mitigate this distortion is the use of decoupling capacitors. FIG. 3A depicts an amplifier 18, with input 16 and output 20 RF impedance matching networks. Also depicted in FIG. 3A are the gate and drain bias feed circuits required to bias the transistor 18 to the desired class of operation (e.g., class AB for the first amplifier 18a and class C for the second amplifier 18b). These bias feed circuits include RF capacitance $C_{RF}$, decoupling capacitors $C_{DC}$, and the $\lambda/4$ transmission line. The RF capacitances $C_{RF}$, which may for example be in the 10-20 pF range, provide a short circuit for the quarter-wavelength for impedance matching. That is, on the gate bias feed circuit, for example, $C_{RF}$ is effectively a short circuit at RF frequencies. The decoupling capacitors $C_{DC}$, which may for example be in the 10 uF range, mitigate distortion at lower frequencies, for example below 100 MHz.

FIG. 3B depicts an implementation of the circuit of FIG. 3A on a circuit package. As known in the art, a circuit package may include one or more RF amplifier circuits (e.g., transistor amplifiers), as well as other circuits, such as impedance matching circuits, power distribution circuits, and the like. A circuit package facilitates incorporating the amplifier circuit(s) into another circuit by providing a physical, mechanical, and electrical connection to, e.g., a Printed Circuit Board (PCB). As electronic device sizes continue to shrink, in many cases the size of a package is limited by the number, and relative size, of pins, pads, or similar interface elements that connect circuits on the package with the PCB (herein, "pins/connectors"). The amplifier 18 is implemented as a transistor (e.g., a LDMOS or GaN HEMT). The input 16 and output 20 RF impedance matching circuits are implemented as LC networks formed on the package, although in other embodiments some or all of the LC circuits may be external to the package. The capacitances $C_{RF}$ and $C_{DC}$ are external to the package. The $\lambda/4$ transmission line is represented as the feed inductance $L_F$ of bond wires connecting the gate or drain bias voltage to the respective RF impedance matching circuit 16, 20.

A known issue with the gate and drain bias voltage feed circuits is that resonance caused by the combination of the capacitors and inductances is close to the band of operation, which limits the improvement in linearity. Hence, a primary challenge to highly linear, broadband operation of Doherty amplifiers is to minimize the bias voltage feed inductance $L_F$, to keep the resonance away from the operating band.

Another challenge is to minimize space and weight, particularly for amplifiers used in communications systems. Spatial diversity and spatial multiplexing are both techniques adopted in modern and future wireless communication networks to improve quality and increase data rates. Spatial diversity refers to transmitting the same signal on different propagations paths (e.g., different transmit/receive antennas), which increases robustness against fading, co-channel interference, and other deleterious effects of RF signal transmission. Spatial multiplexing also uses multiple transmit and receive antennas, and refers to transmitting different portions of data on different propagation paths, using space-time coding, to increase data rates. These techniques are collectively referred to as Multiple Input, Multiple Output, or "MIMO." The key to all MIMO techniques is the deployment of multiple antennas, on at least one and preferably both sides of the air interface channel. Fourth generation (4G) network standards contemplate 2, 4, or 8 antennas per transceiver; however, fifth generation (5G) networks currently being defined envision up to 128 antennas per transceiver. Each antenna used to transmit an RF signal requires a power amplifier. Hence, compact design, and the integration of as many components as possible into the same package, become important design considerations for RF power amplifiers.

In particular, it becomes necessary to implement both the first ("main") and second ("auxiliary") transistors of a Doherty amplifier on the same package. Challenges to such integration arise not only from fitting the devices themselves onto a substrate, as well as supporting circuits such as the input 16 and output 20 RF impedance matching networks, but also the pads/pins/connector spacing and placement. RF input and output leads are typically wider than other signal connections, and reducing their size negatively impacts performance. Accordingly, RF signal input and output connections for multiple amplifiers integrated into the same package are typically located adjacently on the package sides, with other connections (e.g., bias voltages) to the outside of the RF signal input/output connections.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, in integrating RF power amplifier circuits on a package, at least one bias voltage is coupled to at least one amplifier circuit on the package via two or more pins/connectors. In particular, at least one of a gate and drain bias voltage is coupled to one or more amplifier circuits via at least two pins/connectors. In some embodiments, the two or more bias voltage pins/connectors are connected together on the package, placing the pins/connectors in parallel, which reduces an inductance associated with the pins/connectors. In some embodiments, at least of the two pins/connectors connected to the same bias voltage are disposed on either side of an RF signal pin/conductor, simplifying the routing of signals on the package, affording greater flexibility of placement and routing on the package One embodiment relates to an electronic circuit package housing one or more amplifier circuits. The package includes a first amplifier circuit having source, gate, and drain terminals. The source terminal is connected to RF signal ground. A first RF input connector is connected to the first amplifier circuit gate terminal. A first RF output connector is connected to the first amplifier circuit drain terminal. A first gate bias voltage connector is coupled to the gate terminal of the first amplifier circuit. A first drain bias voltage connector is coupled to the drain terminal of the first amplifier circuit. At least one of: a second gate bias voltage connector is connected to the first gate bias voltage connector, and a second drain bias voltage connector is connected to the first drain bias voltage connector.

Another embodiment relates to a method of fabricating an electronic circuit package housing one or more amplifier circuits. A first amplifier circuit is placed on the package. The first amplifier circuit has source, gate, and drain terminals. The source terminal is connected to RF signal ground. A first RF input connector is connected to the first amplifier circuit gate terminal. A first RF output connector is connected to the first amplifier circuit drain terminal. A first gate bias voltage connector is coupled to the gate terminal of the first amplifier circuit. A first drain bias voltage connector is coupled to the drain terminal of the first amplifier circuit. At least one of: a second gate bias voltage connector is connected to the first gate bias voltage connector, and a second drain bias voltage connector is connected to the first drain bias voltage connector.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

FIG. 13 is a flow diagram of a method 100 of fabricating an electronic circuit package.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Embodiments of the present invention relate to the connections of signals, such as bias voltages, to amplifier circuits on a package. As discussed above, due to the proliferation of RF power amplifiers in many applications, it is advantageous to package two or more amplifier circuits together into a single package. One particular application of this packaging is the integration of the two amplifier circuits of a Doherty amplifier together on a package, although of course many other amplifier circuit configurations may advantageously be packaged according to embodiments of the present invention.

The package may, for example, comprise a small printed circuit board (PCB), or a multi-chip module (MCM) substrate, with two or more amplifiers, and possibly additional discrete components, integrated thereon. Circuits on the package may be encapsulated, with electrical connections provided via pins—in this case, the package forms a conventional packaged integrated circuit. Alternatively, the package may comprise a PCB or substrate with amplifier circuits (and possibly other components) affixed thereon, with bonding pads at the edges, wherein connection to another circuit is made via bonding wires or other known circuit interconnect technology. All such electrical connections are collectively referred to herein as "pins/connectors," or simply "connectors," a term which should be broadly construed to encompass any means of connecting an electrical signal or voltage level external to a package, to one or more circuits or components on the package.

Figure 4:
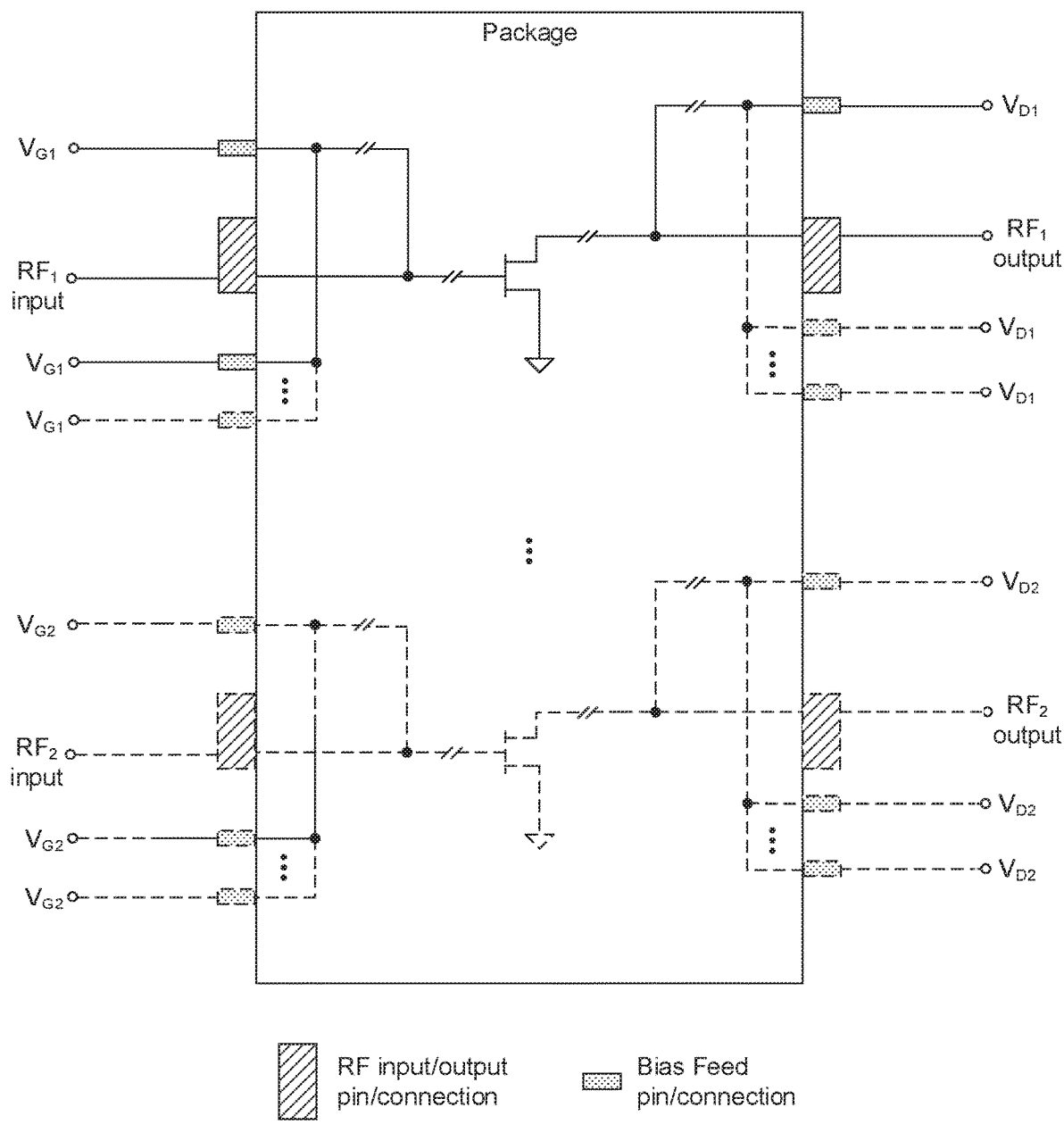
FIG. 4 is a connection diagram showing one embodiment of the connection of RF signal and bias voltage connections to a package housing one or more amplifier circuits.
Figure 5:
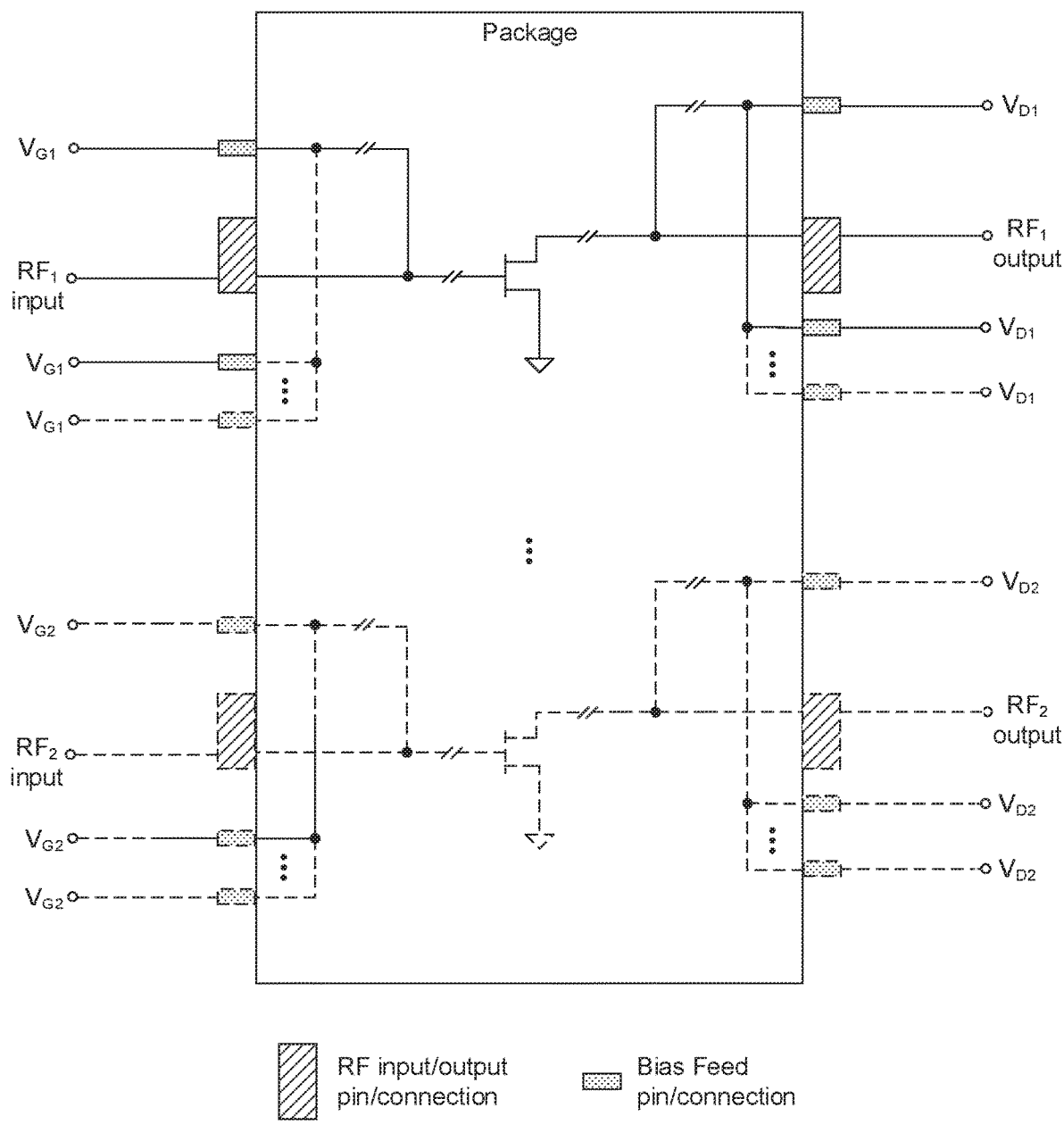
FIG. 5 is a connection diagram showing another embodiment of the connection of RF signal and bias voltage connections to a package housing one or more amplifier circuits.

FIGS. 4 and 5 depict two embodiments of the present invention, in which at least one of a gate or drain bias voltage is supplied to at least one amplifier circuit on a package via two or more pins/connections. For example, FIG. 4 depicts a first gate voltage $V_{G1}$ connecting to the package via at least two pins/connections (and optionally more, as indicated by the dashed lines and ellipses). In this embodiment, at least two of the $V_{G1}$ pins/connections are disposed on opposite sides of the $RF_1$ input pin/connection. As known in the art, the bonding pad area of RF pins/connections is significantly larger than that for other signals. The pad width is dependent on power and the output impedance of the transistor. In particular, as the RF power increases, the impedance decreases, thus necessitating a larger RF pad width. In contrast, the bias feed pin/connector bonding pads required only sufficient width to support the current, and are hence narrower.

Typically, RF pins/connections of the same type (e.g., input or output), for two or more amplifier circuits, are disposed adjacent on one side of the package, without other signal pins/connectors between them. However, according to embodiments of the present invention, a gate and/or drain bias voltage feed circuit connects to amplifier circuits on the package via pins/connectors disposed on opposite sides of an RF signal pin/connectors. Consequently, one or more gate and/or drain bias voltage feed circuit pins/connectors are disposed between RF signal pins/connectors, as depicted for the gate bias voltage case in FIG. 4. This configuration provides at least the benefit of simplifying wiring on the package, in distributing the multiple gate bias voltage feeds to one or more amplifier circuits on the package.

As indicated by the broken circuit lines on the package, the gate bias voltage $V_{G1}$ may be distributed one or more amplifier circuits—for example, a plurality of stages in a multi-stage amplifier circuits comprising serially-connected amplifier stages. Similarly, a drain bias voltage $V_{D1}$ is distributed to at least one, and possibly more, amplifier circuits. The drain bias voltage $V_{D1}$ is depicted in FIG. 4 as connecting to an amplifier circuit via only one pin/connection; however, as indicated by dashed lines and ellipses, it may additionally connect via multiple pins/connectors, which may be disposed on either side of an $RF_1$ output signal pin/connector.

FIG. 4 indicates, by the dashed-line depiction of the lower amplifier circuit and its associated pins/connections, that two or more amplifier circuits may be integrated on the package, and that gate and/or bias voltages may each be connected to the additional amplifier circuits via two or more respective pins/connections. The gate and drain bias voltages are denoted as $V_{G2}$ and $V_{D2}$, respectively, indicating that the gate and drain bias voltages for the second amplifier circuit may be different than those provided to the first amplifier circuit. This may be the case, for example, for a Doherty amplifier, wherein a main amplifier circuit may be biased to, e.g., class AB operation, and an auxiliary or peaking amplifier circuit may be biased to, e.g., class C operation. Hence at least one of $V_{G1} \neq V_{G2}$, or $V_{D1} \neq V_{D2}$ is true. Alternatively, in other embodiments, both gate bias voltages, and/or both drain bias voltages, for two or more amplifier circuits, may be the same. That is, at least one of $V_{G1} = V_{G2}$, or $V_{D1} = V_{D2}$ is true.

FIG. 5 depicts another embodiment of a package in which at least one of a gate and drain bias voltage—in this case, the drain bias voltage $V_{D1}$—is connected to one or more amplifier circuits via two or more pins/connectors. In this embodiment, two pins/connectors connecting the drain bias voltage $V_{D1}$ to one or more amplifier circuits are disposed on either side of an RF1 output pin/connector. Accordingly, in the case of two or more amplifier circuits on the package (as indicated by dashed lines in the lower portion of FIG. 5), at least one drain bias voltage pin/connector is disposed between two RF signal output pins/connectors. As indicated by the dashed lines and ellipses, three or more pins/connectors may connect to the same drain bias voltage $V_{D1}$. As indicated by the broken circuit lines on the package, the drain bias voltage $V_{D1}$ may be distributed one or more amplifier circuits—for example, a plurality of stages in a multi-stage amplifier circuits comprising serially-connected amplifier stages.

FIG. 5 depicts at least one pin/connector connecting a gate bias voltage $V_{G1}$ to one or more amplifier circuits. However, as indicated by the dashed lines and ellipses, the gate bias voltage $V_{G1}$ may be connected to one or more amplifier circuits via two or more pins/connectors. As described above with respect to FIG. 4, two or more amplifier circuits may be disposed on the package, with the same or separate gate and/or drain bias voltages provided to each. That is, $V_{G2}$ may be the same gate bias voltage as $V_{G1}$ or it may be different. Similarly, it may be the case that $V_{D1} = V_{D2}$, or that $V_{D1} \neq V_{D2}$.

Figure 6:
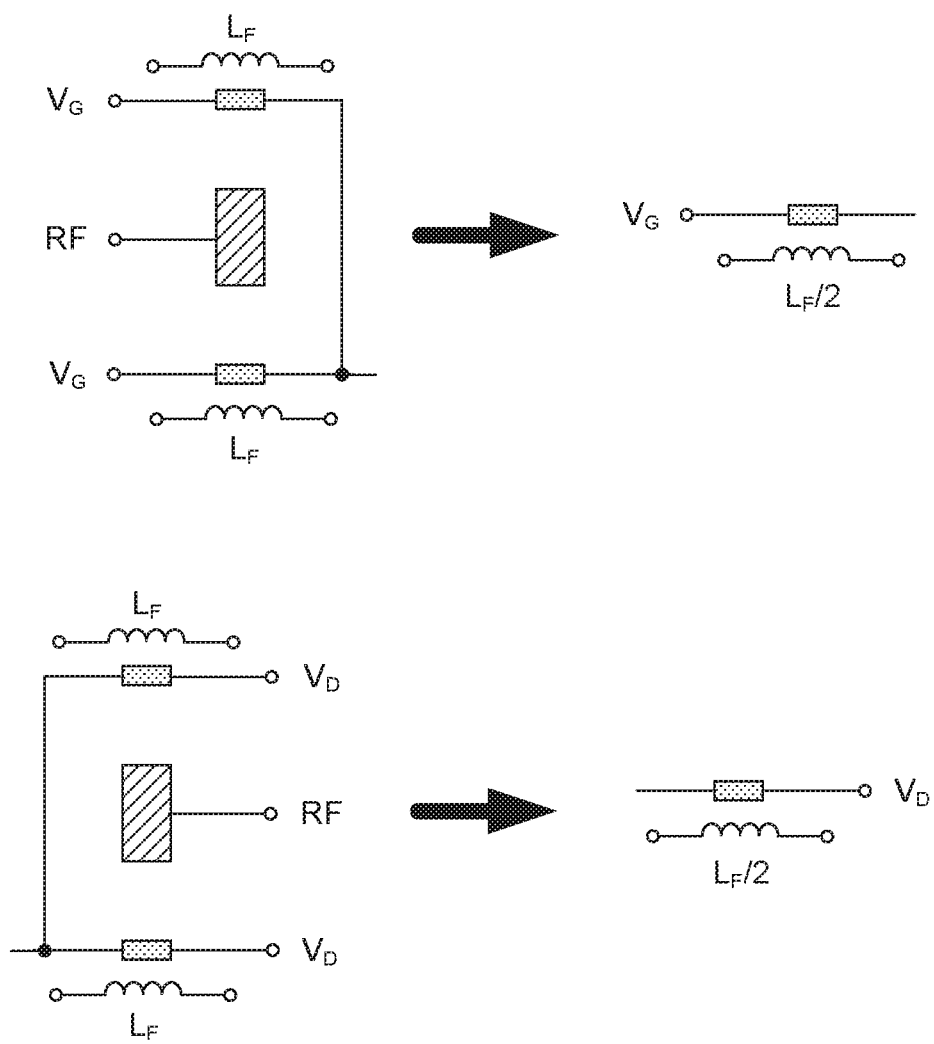
FIG. 6 is an equivalent circuit diagram showing the reduction in inductance of two bias voltage pins/connectors in parallel.

FIG. 6 depicts equivalent circuits for both the gate and drain bias feed inductances $L_F$ (see FIG. 3B) for the case of two bias voltage pins/connectors. Considering the gate bias case, the two gate bias voltage pins/connectors, on either side of the RF signal input pin/connector, each individually present a gate bias feed inductance of $L_F$, comprising primarily the inductance of bonding wires. However, since the two gate bias voltage pins/connectors are connected to a common node on the package, they are topologically configured in parallel. Thus, the equivalent inductance seen by the package is that shown on the right, which is nominally $L_F/2$, or half of the characteristic inductance of a single gate bias voltage pin/connector.

Similarly, the inductance of a parallel connection of drain bias voltage pins/connectors, which are disposed on either side of the RF output signal connector, is also $L_F/2$, where $L_F$ is the characteristic inductance of a single drain bias voltage pin/connector. By substantially halving the connector inductance, embodiments of the present invention keep the resonance with capacitances $C_{DC}$ away from the desired operating band, particularly in the video frequencies around 100 MHz. The added gate and drain bias voltage pins/connectors thus contribute to wideband linearity of RF amplifiers, such as the RF amplifiers 18a, 18b of a Doherty amplifier configuration 10 (FIGS. 1, 2), when they are integrated together in a package.

Figure 1:
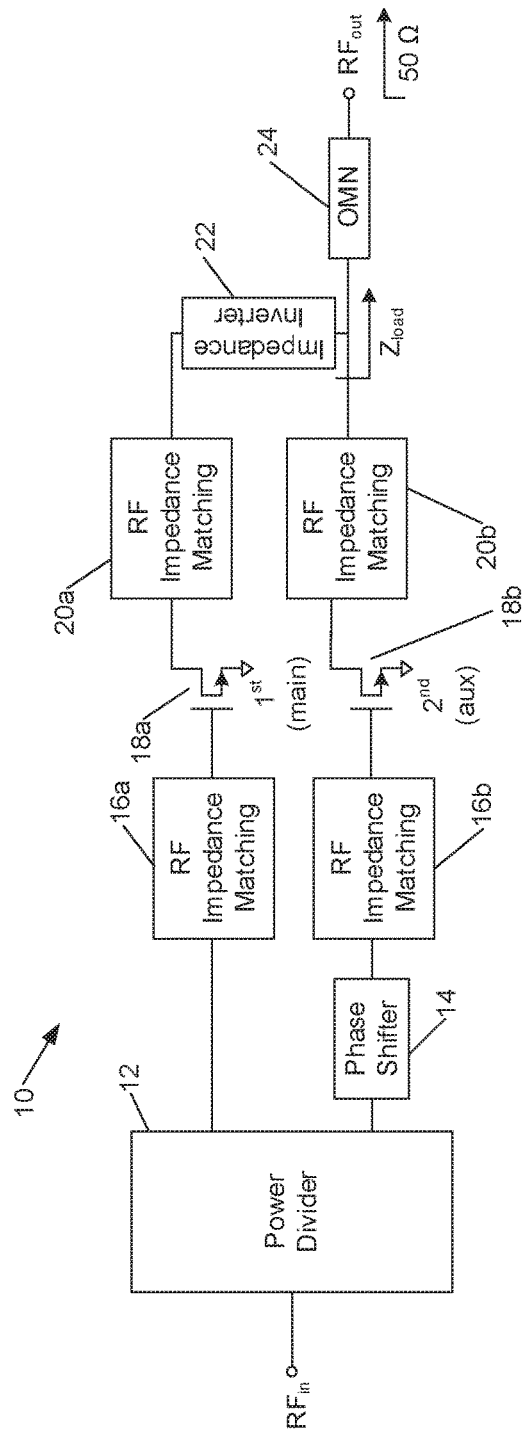
FIG. 1 is a block diagram of a Doherty amplifier.
Figure 2:
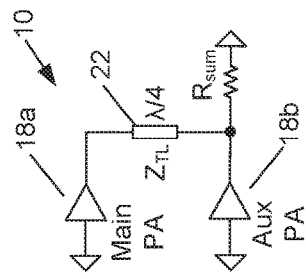
FIG. 2 is a circuit model of a Doherty amplifier.
Figure 3A:
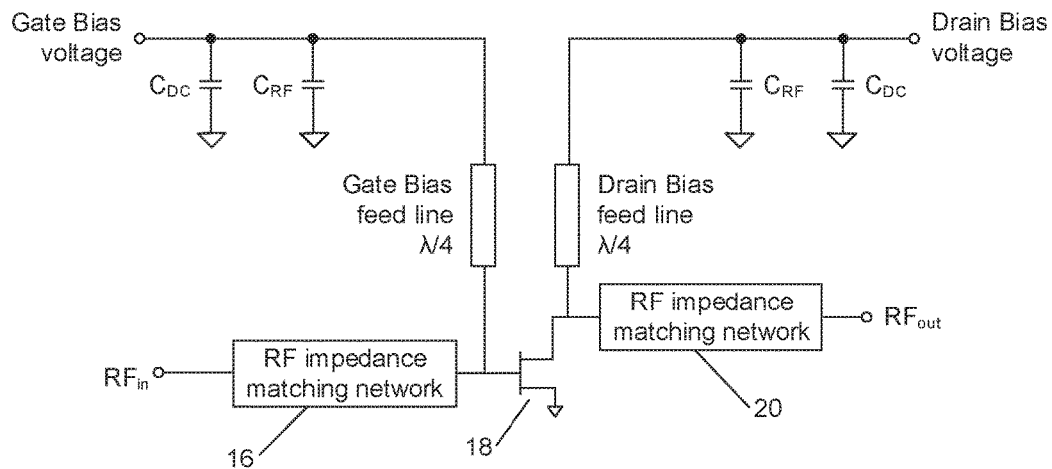
FIG. 3A is a block diagram of an amplifier with bias voltage feed circuits.
Figure 3B:
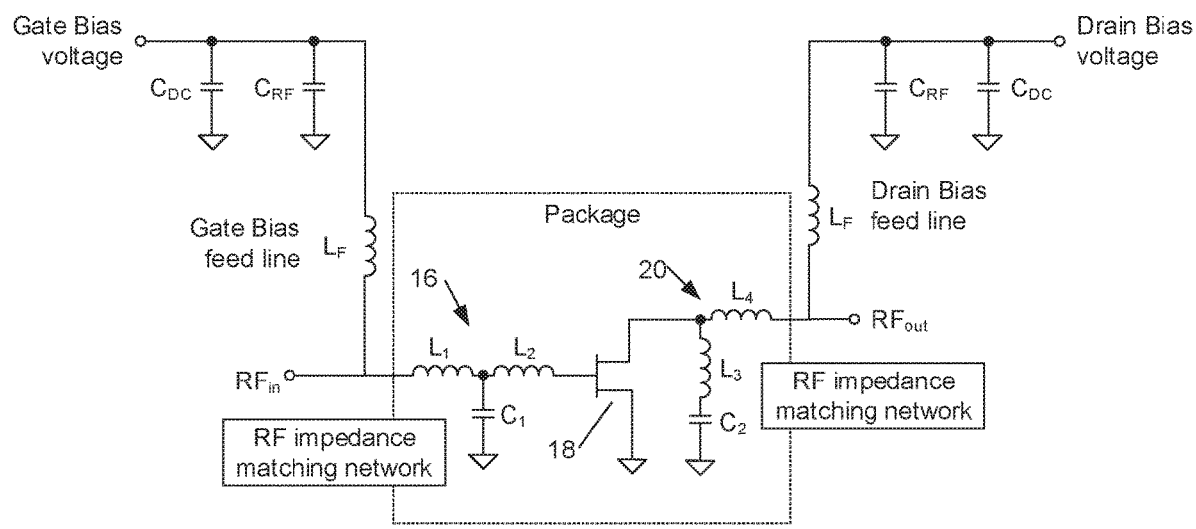
FIG. 3B is a circuit diagram of the amplifier of FIG. 3A.
Figure 7:
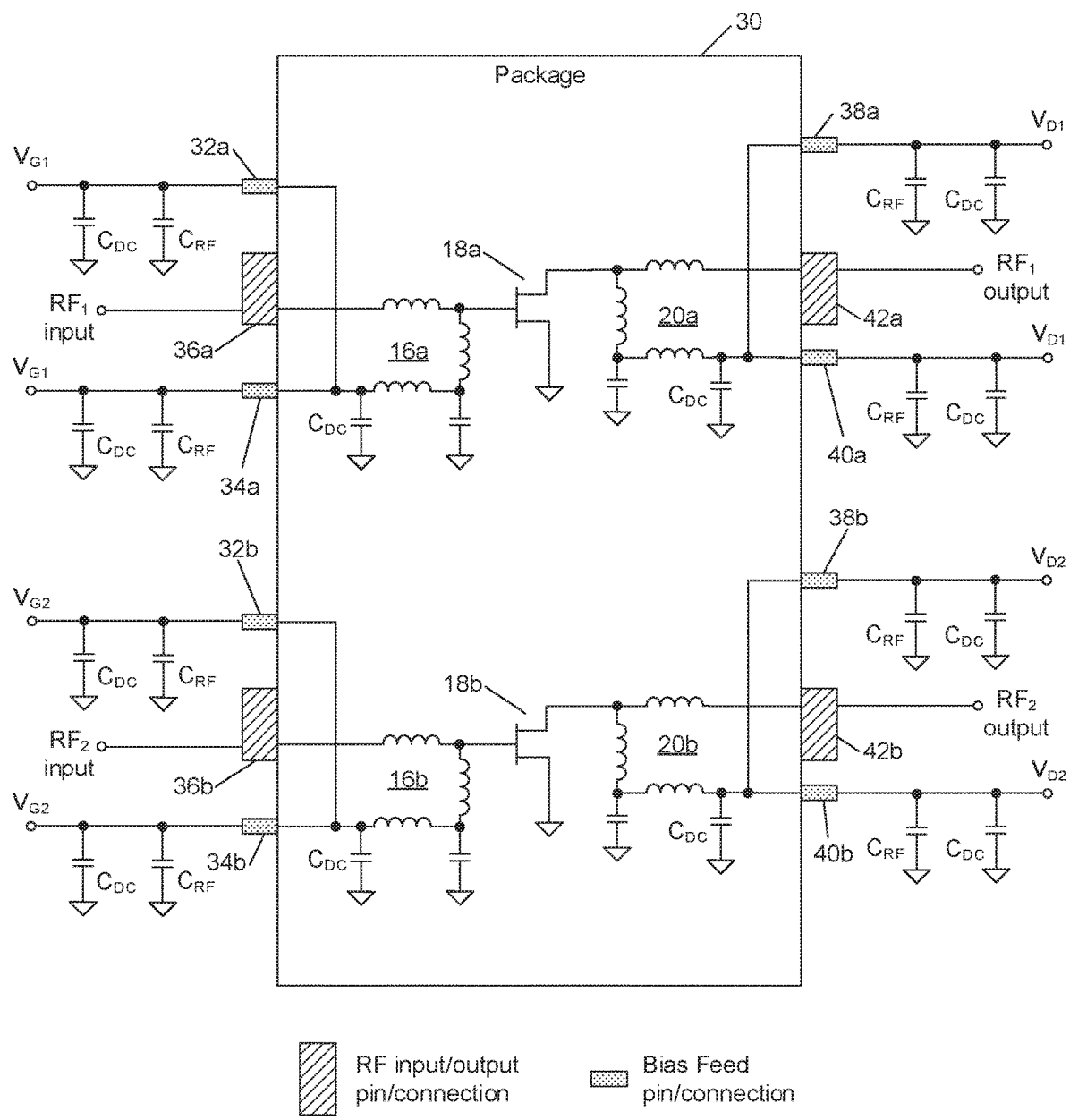
FIG. 7 is a circuit diagram showing two amplifier circuits and impedance matching circuits on a package, with bias voltages to each connected to multiple pins/connectors.

FIG. 7 depicts a circuit package 30 including two amplifiers 18a, 18b. In one embodiment, the amplifiers are the first 18a and second 18b amplifiers of a Doherty amplifier configuration 10, as depicted in block diagram form in FIG. 1 and as a circuit model in FIG. 2. In general, however, embodiments of the present invention may be advantageously applied to any two or more amplifiers 18a, 18b integrated onto the same package 30, whether or not they are configured and operated as a Doherty amplifier 10. Integrated with the amplifiers 18a, 18b are the input 16a, 16b and output 20a, 20b RF impedance matching circuits, as depicted in FIGS. 1, 3A, and 3B.

A first gate bias voltage $V_{G1}$ is connected to the package 30 via two pins/connectors 32a, 34b, disposed on both sides of an $RF_1$ signal input pin/connector 36a. The gate bias voltage pins/connectors 32a, 32b are connected on the package, placing the inductances associated with the pins/connectors 32a, 32b in parallel, which nominally halves the effective inductance. In some embodiments, this reduced inductance is effective to move resonance with the decoupling capacitors $C_{DC}$ away from the frequencies of interest. The gate bias voltage $V_{G1}$ is coupled to the gate terminal of the first amplifier circuit 18a, via an input RF impedance matching circuit 16a.

Similarly, a second gate bias voltage $V_{G2}$ is connected to the package 30 via two pins/connectors 32b, 34b, disposed on both sides of an $RF_2$ signal input pin/connector 36b. The gate bias voltage pins/connectors 32b, 34b are also in parallel, halving the effective pin/connector inductance. The gate bias voltage $V_{G2}$ is coupled to the gate terminal of the second amplifier 18b, via an input RF impedance matching circuit 16b. The gate bias voltages $V_{G1}$, $V_{G2}$ may be the same value or different.

On the output side, a first drain bias voltage $V_{D1}$ is connected to the package 30 via two pins/connectors 38a, 40a, disposed on both sides of an $RF_1$ signal output pin/connector 42a. Similarly, a second drain bias voltage $V_{D2}$ is connected to the package 30 via two pins/connectors 38b, 40b, disposed on both sides of an $RF_2$ signal output pin/connector 42b. Each drain bias voltage $V_{D1}$, $V_{D2}$ is coupled to the drain terminal of an associated amplifier circuit 18a, 18b via a respective output RF impedance matching circuit 20a, 20b. Each of the pairs of drain bias voltage pins 38a, 40a and 38b, 40b are connected on the package, and hence the inductances associate with the pins/connectors are in parallel, reducing their values.

Similarly, a second drain bias voltage $V_{D2}$ is connected to the package 30 via two pins/connectors 38b, 40b, disposed on both sides of an $RF_2$ signal output pin/connector 42b. The drain bias voltage pins/connectors 38b, 40b are also in parallel, halving the effective pin/connector inductance. The drain bias voltage $V_{D2}$ is coupled to the drain terminal of the second amplifier 18b, via an output RF impedance matching circuit 20b. The drain bias voltages $V_{D1}$, $V_{D2}$ may be the same value or different.

The configuration of FIG. 7 provides substantial benefit in reducing bias voltage pin/connector inductances, by configuring pin/connector pairs 32/34 and/or 38/40 in parallel. In some embodiments, particularly where space between the RF input 36 and output 42 signal pins/connectors is at a premium, sufficient benefit may be obtained by shaping the resonance frequency of only the first (main) amplifier 18a.

Figure 8:
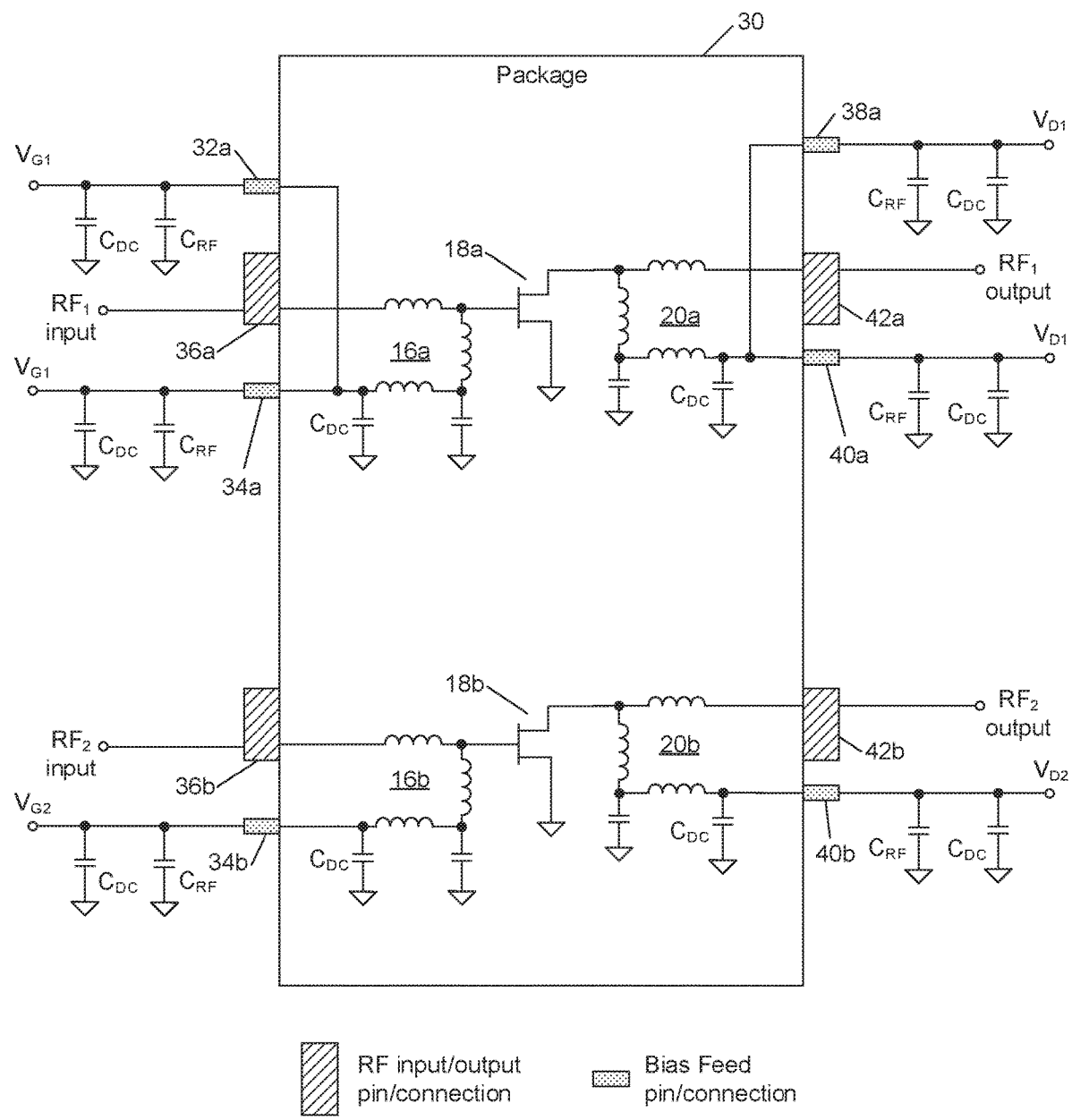
FIG. 8 is a circuit diagram showing two amplifier circuits and impedance matching circuits on a package, with bias voltages to only one connected to multiple pins/connectors.

FIG. 8 depicts an embodiment in which gate and drain bias voltages $V_{G1}$, $V_{D1}$ are coupled to only the first amplifier circuit 18a via multiple (in this case, dual) pins/connectors 32a, 34a and 38a, 40a, respectively. Due to the parallel topology of these pairs of pins/connectors, the effective gate/drain bias voltage pin/connector inductance (as modeled, for example, in FIG. 3B) is nominally $L_F/2$. Because of space constraints, the operating properties of the Doherty amplifier 10, or other reasons, the second (auxiliary) amplifier 18b receives corresponding gate and drain bias voltages $V_{G2}$, $V_{D2}$ conventionally, via a single respective pin/connector 34b, 40b. The bias voltages are coupled to the respective gate and drain terminals of the amplifier 18b via input 16b and output 20b RF impedance matching circuits. As modeled in FIG. 3, the gate/drain bias voltage pin/connector inductance is $L_F$.

Figure 9:
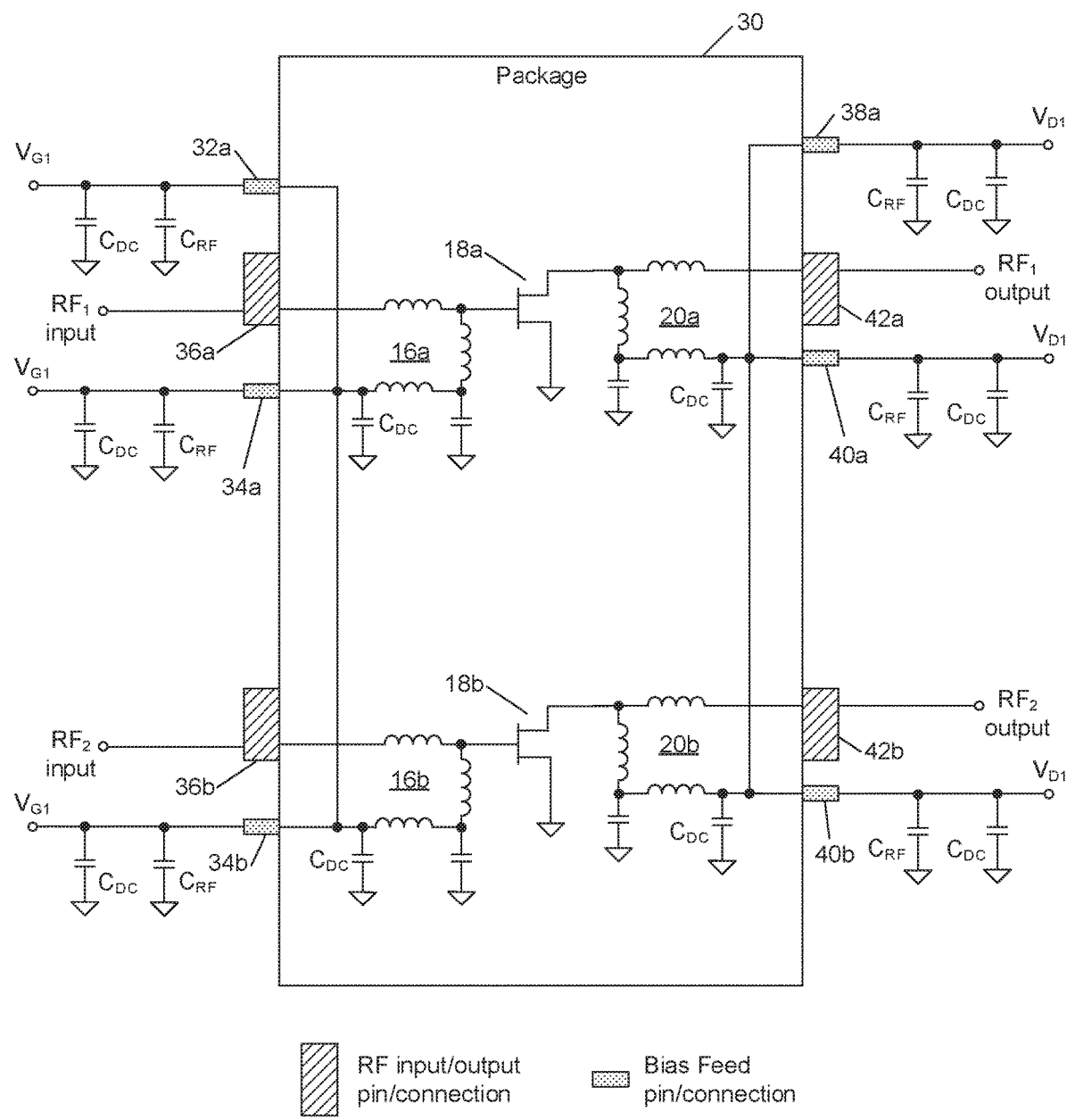
FIG. 9 is a circuit diagram showing two amplifier circuits and impedance matching circuits on a package, with bias voltages shared by both amplifiers.

FIG. 9 depicts a compromise between the embodiments of FIGS. 7 and 8, wherein space constraints dictate only one bias voltage pin/connector between each pair of RF signal pins/connectors, but providing an impedance reduction, and hence resonance shaping benefit, to both amplifiers.

In the embodiment of FIG. 9, the gate bias voltage VG1 is coupled to both the first 18 and second 18b amplifier circuits via three gate bias voltage pins/connectors 32a, 34a, 34b. All three pins/connectors 32a, 34a, 34b are connected on the package 30, hence all three pins/connectors 32a, 34a, 34b are configured in parallel. The effective gate bias voltage pin/connector inductance seen by both amplifiers 18a and 18b is thus nominally $L_F/3$. Hence, in this embodiment, both amplifiers 18a, 18b experience greater bandwidth and linearity—albeit less than if each had two gate bias voltage pins/connectors as in FIG. 7—at the space and cost constraint of only one gate bias voltage pin/connector 34a disposed between the $RF_1$ and $RF_2$ input signal connectors 36a, 36b. One constraint of this configuration is that the first 18a and second 18b amplifier must be biased to the same gate bias voltage value. The drain bias voltage VD1 is similarly coupled to the drain terminals of both first 18a and second 18b amplifiers via three drain bias voltage pins/connectors 38a, 40a, 40b. Because these three pins/connectors 38a, 40a, 40b are connected together on the package 30, the effective drain bias voltage pin/connector inductance is $L_F/3$.

Figure 10:
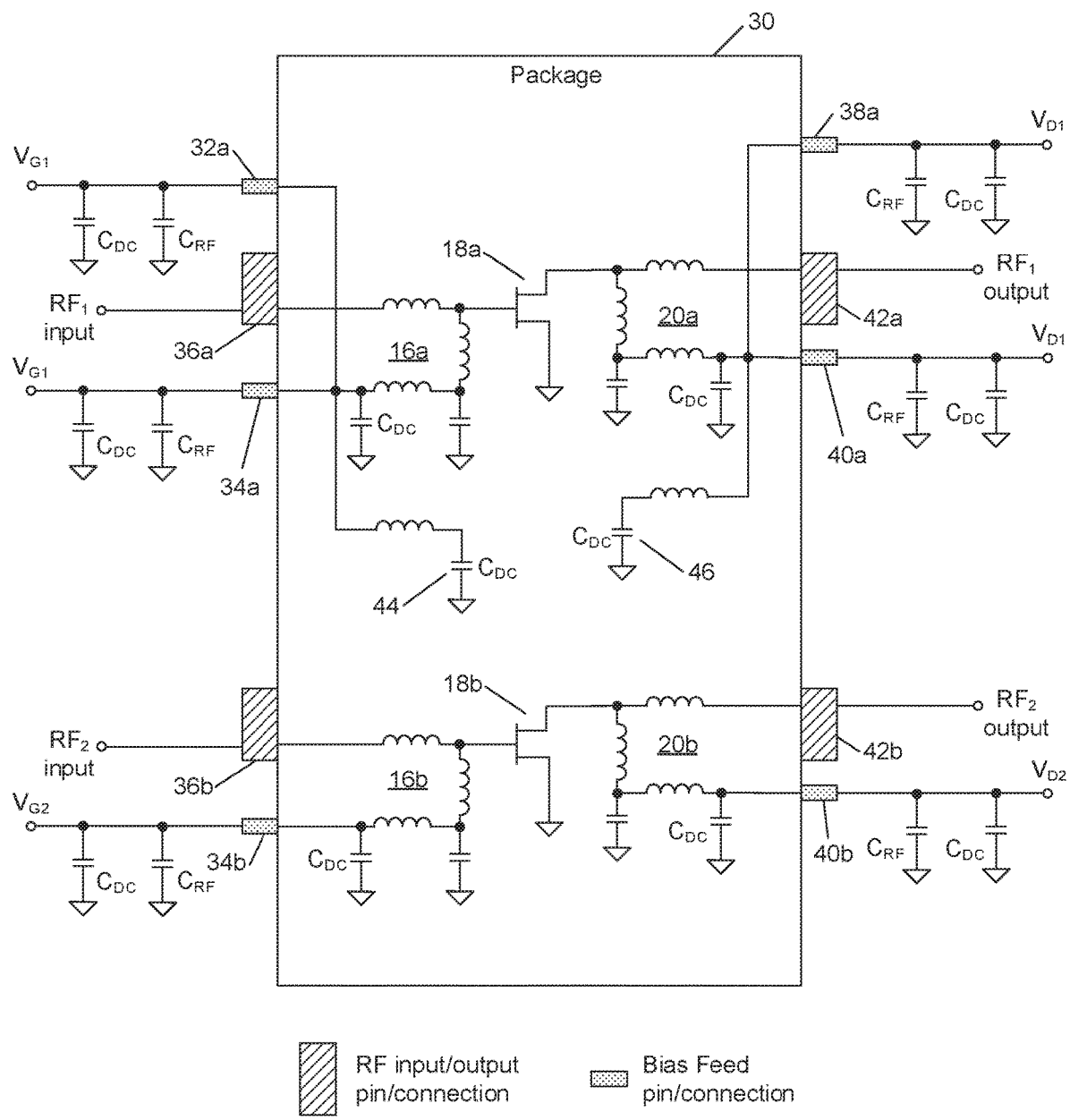
FIG. 10 is a circuit diagram showing two amplifier circuits and impedance matching circuits on a package, with bias voltages to only one amplifier connected to multiple pins/connectors, and additional decoupling capacitors on the package.

FIG. 10 depicts an embodiment in which, similar to the embodiment of FIG. 8, only the first amplifier 18a is provided with two each of gate bias voltage pins/connectors 32a, 34a and drain bias voltage pins/connectors 38a, 40a; the second amplifier 18b receives gate and drain bias voltages only from single gate 34b and drain 40b bias voltage pins/connectors. However, in the embodiment of FIG. 10, the gate and drain bias voltage pins/connectors are connected, on the package 30, to additional decoupling capacitors 44, 46, respectively. This provides designers greater flexibility in shaping the resonance of the bias voltage pin/connector inductance $L_F/2$ with capacitances, such as external decoupling capacitors $C_{DC}$ and RF capacitors $C_{RF}$, as well as the on-chip decoupling capacitors 44, 46. In this embodiment, only the first (main) amplifier 18a is provided with this additional tool for shaping the resonance frequency. In other embodiments, additional decoupling capacitors may additionally be added, on the package 30, for the second amplifier 18b.

Figure 11:
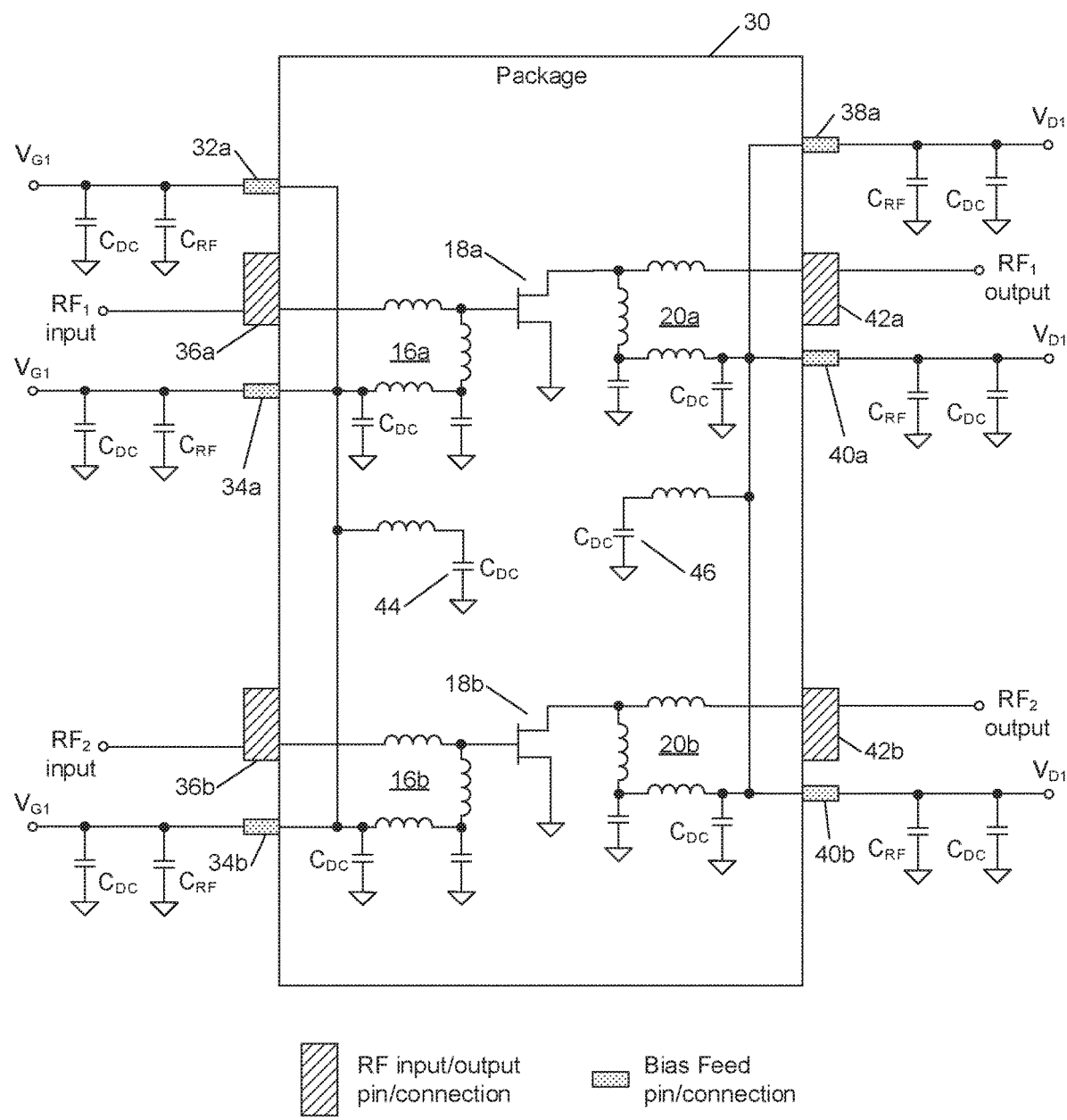
FIG. 11 is a circuit diagram showing two amplifier circuits and impedance matching circuits on a package, with bias voltages and additional decoupling capacitors shared by both amplifiers.

FIG. 11 depicts an embodiment in which a gate bias voltage $V_{G1}$ is coupled to the gate terminals of both the first 18a and second 18b amplifiers, and a decoupling capacitor 44 on the package 30, via three gate bias voltage pins/connectors 32a, 34a, 34b. Similarly, a drain bias voltage $V_{D1}$ is coupled to the drain terminals of both the first 18a and second 18b amplifiers, and a decoupling capacitor 46 on the package 30, via three drain bias voltage pins/connectors 38a, 40a, 40b. Here again, because the three-way connections result in the gate 32a, 34a, 34b and drain 38a, 40a, 40b bias voltage pins/connectors being configured in parallel, the gate and drain bias voltage pin/connector inductances are nominally $L_F/3$. In this embodiment, both amplifiers 18a, 18b benefit from a reduction in the bias feed inductance $L_F$, and additional capacitance to shape the resonance frequency, while adding only two connectors to the package 30 between the $RF_1$ and $RF_2$ signal connectors. As in the embodiment of FIG. 9, the two amplifiers 18a, 18b are restricted to using the same gate and drain bias voltage values.

Figure 12:
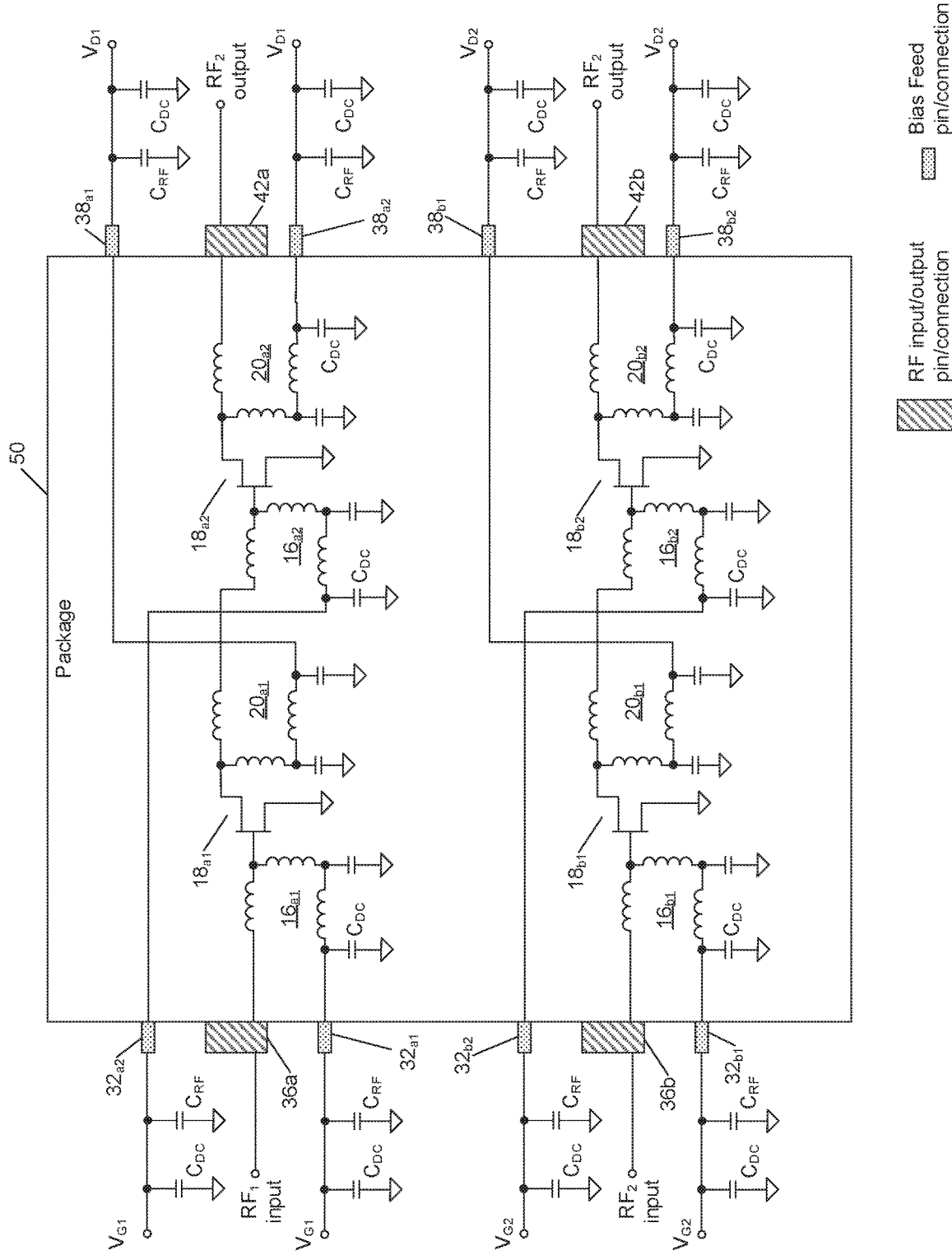
FIG. 12 is a circuit diagram of two multi-stage amplifiers and impedance matching circuits on a package, showing bias voltage distribution to each amplifier stage.

FIG. 12 depicts another embodiment of the present invention, wherein a plurality of bias voltage pins/connectors connect bias voltages to amplifier circuits, and wherein some bias voltage pins/connectors are disposed between RF signal pins/connectors. In this embodiment, two multi-stage amplifiers are formed on the same package 50. A first multi-stage amplifier comprises a first amplifier stage $18_{a1}$ and a second amplifier stage $18_{a2}$. Each amplifier stage $18_{a1}$, $18_{a2}$ includes an input $16_{a1}$, $16_{a2}$ and output $20_{a1}$, $20_{a2}$ RF impedance matching circuit. The drain terminal of the first amplifier stage $18_{a1}$ is coupled to the gate terminal of the second amplifier stage $18_{a2}$, resulting in a series connection of the amplifier stages. According to the embodiment of FIG. 12, a first gate bias voltage pin/connector $32_{a1}$, disposed between the $RF_1$ and $RF_2$ input signal pins/connectors 36a, 36b, couples a first gate bias voltage $V_{G1}$ to the gate terminal of the first stage $18_{a1}$ of the first multi-stage amplifier, via the first input RF impedance matching circuit $16_{a1}$. A second gate bias feed circuit connector $32_{a2}$, disposed to the outside of the $RF_1$ and $RF_2$ input signal connectors 36a, 36b, couples the first gate bias voltage $V_{G1}$ to the gate terminal of the second stage $18_{a2}$ of the first multi-stage amplifier, via the second input RF impedance matching circuit $16_{a2}$. Of course, in another embodiment these two connectors $32_{a1}$, $32_{a2}$ could couple to the gate terminals of the opposite stages of the first multi-stage amplifier.

Similarly, a first drain bias voltage pin/connector $38_{a1}$, disposed to the outside of the $RF_1$ and $RF_2$ output signal connectors 42a, 42b, couples a first drain bias voltage $V_{D1}$ to the drain terminal of the first stage $18_{a1}$ of the first multi-stage amplifier, via the first output RF impedance matching circuit $20_{a1}$. A second drain bias voltage pin/connector $38_{a2}$, disposed between the $RF_1$ and $RF_2$ output signal connectors 42a, 42b, couples the first drain bias voltage $V_{D2}$ to the drain terminal of the second stage $18_{a2}$ of the first multi-stage amplifier, via the second output RF impedance matching circuit $20_{a2}$. Of course, in another embodiment these two connectors $38_{a1}$, $38_{a2}$ could couple to the drain terminals of the opposite stages of the first multi-stage amplifier.

A second multi-stage amplifier integrated on the same package 50 comprises a first amplifier stage $18_{b1}$ and a second amplifier stage $18_{b2}$. Each amplifier stage $18_{b1}$, $18_{b2}$ includes an input $16_{b1}$, $16_{b2}$ and output $20_{b1}$, $20_{b2}$ RF impedance matching circuit. The drain terminal of the first amplifier stage $18_{b1}$ is coupled to the gate terminal of the second amplifier stage $18_{b2}$, resulting in a series connection of the amplifier stages. According to the embodiment of FIG. 12, a third gate bias voltage pin/connector $32_{b1}$, disposed to the outside of the $RF_1$ and $RF_2$ input signal pins/connectors 36a, 36b, couples a second gate bias voltage $V_{G2}$ to the gate terminal of the first stage $18_{b1}$ of the second multi-stage amplifier, via the first input RF impedance matching circuit $16_{b1}$. A fourth gate bias feed circuit connector $32_{b2}$, disposed between the $RF_1$ and $RF_2$ input signal pins/connectors 36a, 36b, couples the second gate bias voltage $V_{G2}$ to the gate terminal of the second stage $18_{b2}$ of the second multi-stage amplifier, via the second input RF impedance matching circuit $16_{b2}$. Of course, in another embodiment these two connectors $32_{b1}$, $32_{b2}$ could couples to the opposite stages of the second multi-stage amplifier.

Similarly, a third drain bias voltage pin/connector $38_{b1}$, disposed between the $RF_1$ and $RF_2$ output signal pins/connectors 42a, 42b, couples a second drain bias voltage $V_{D2}$ to the drain terminal of the first stage $18_{b1}$ of the second multi-stage amplifier, via the first output RF impedance matching circuit $20_{b1}$. A fourth drain bias voltage pin/connector $38_{b2}$, disposed to the outside of the $RF_1$ and $RF_2$ output signal connectors 42a, 42b, couples the second drain bias voltage $V_{D2}$ to the drain terminal of the second stage $18_{b2}$ of the second multi-stage amplifier, via the second output RF impedance matching circuit $20_{b2}$. Of course, in another embodiment these two pins/connectors $38_{b1}$, $38_{b2}$ could couple to the drain terminals of the opposite stages of the second multi-stage amplifier.

In the embodiment of FIG. 12, the gate and drain bias feed inductances $L_F$ are not reduced by connecting the relevant pairs of bias feed circuit connectors to the same node on the package 50, placing the connectors (and hence the inductance of their associated bonding wires) in parallel. Rather, in this embodiment, the connection of gate and drain bias voltages to two or more pins/connectors is used to connect the bias voltages to different stages of two multi-stage amplifiers. In different embodiments $V_{G1}$ and $V_{G2}$ may be the same voltage, or may be different bias voltages. Similarly, in different embodiments $V_{D1}=V_{D2}$ or $V_{D1} V_{D2}$.

FIG. 13 depicts the steps in a method 100 of fabricating an electronic circuit package housing one or more amplifier circuits. A first amplifier circuit having source, gate, and drain terminals is placed on the package, and the source terminal is connected to RF signal ground (block 102). A first RF input connector is connected to the first amplifier circuit gate terminal (block 104). A first RF output connector is connected to the first amplifier circuit drain terminal (block 106). A first gate bias voltage connector is coupled to the gate terminal of the first amplifier circuit (block 108). A first drain bias voltage connector is coupled to the drain terminal of the first amplifier circuit (block 110). At least one of the following connections is made: a second gate bias voltage connector is connected to the first gate bias voltage connector (block 112) and/or a second drain bias voltage connector is connected to the first drain bias voltage connector (block 114). The parallel connections of the first and second gate bias voltage connectors or drain bias voltage connectors reduce the effective respective gate or drain bias feed inductance, relative to one respective gate or drain bias voltage connector.

Embodiments of the present invention present numerous advantages over the prior art. As tight integration of RF power amplifiers is increasingly required to meet the demands of more antennas on smaller devices, it is necessary to integrate two or more RF power amplifier circuits on a single package. By supplying bias voltages to amplifier circuits via two or more bias voltage pins/connectors wired in parallel, the characteristic bias voltage pin/connector inductance $L_F$ is reduced, thus moving the resonance between $L_F$ and the various RF and decoupling capacitors away from the operating frequency—particular video frequencies around 100 MHz. Additionally, disposing two of the two or more bias voltage pins/connectors on either side of an RF input/output signal connector promotes a more compact layout and reduces wiring congestion on the package.

Terms such as "same," "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like, are used to describe various elements, regions, sections, etc. and are also not intended to be limiting. Like terms refer to like elements throughout the description.

The term "directly electrically connected" or "electrically connected" or simply "connected" describes a permanent low-ohmic connection between electrically connected elements, for example a wire connection between the concerned elements. Although such a connection may have parasitic effects, such as the parasitic inductance of a bond wire, no component or element is interposed between the connected elements. By contrast, the term "electrically coupled" or simply "coupled" means that one or more intervening element(s) or components, configured to influence the electrical signal in some tangible way, may be (but is not necessarily) provided between the electrically coupled elements. These intervening elements may include active elements, such as transistors or switches, as well as passive elements, such as inductors, capacitors, diodes, resistors, etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an", and "the" are intended to include the plural as well as the singular, unless the context clearly indicates otherwise.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. An electronic circuit package housing one or more amplifier circuits, comprising:
   a first amplifier circuit having source, gate, and drain terminals, the source terminal connected to Radio Frequency (RF) signal ground;
   a first RF input connector directly electrically connected to the first amplifier circuit gate terminal;
   a first RF output connector directly electrically connected to the first amplifier circuit drain terminal;
   a first gate bias voltage connector coupled to the gate terminal of the first amplifier circuit;
   a first drain bias voltage connector coupled to the drain terminal of the first amplifier circuit; and
   at least one of
      a second gate bias voltage connector directly electrically connected to the first gate bias voltage connector; and
      a second drain bias voltage connector directly electrically connected to the first drain bias voltage connector.

2. The package of claim 1 wherein the parallel connections of the first and second gate bias voltage connectors or drain bias voltage connectors reduce the effective respective gate or drain bias feed inductance, relative to one respective gate or drain bias voltage connector.

3. The package of claim 1, wherein either one or both of
   the first and second gate bias voltage connectors are disposed on opposite sides of the first RF input connector; and
   the first and second drain bias voltage connectors are disposed on opposite sides of the first RF output connector.

4. The package of claim 1, further comprising:
   a second amplifier circuit having source, gate, and drain terminals, the source terminal connected to RF signal ground;
   a second RF input connector connected to the second amplifier circuit gate terminal;
   a second RF output connector connected to the second amplifier circuit drain terminal;
   a third gate bias voltage connector coupled to the gate terminal of the second amplifier circuit; and
   a third drain bias voltage connector coupled to the drain terminal of the second amplifier circuit.

5. The package of claim 4, further comprising at least one of
   a fourth gate bias voltage connector directly electrically connected to the third gate bias voltage connector; and
   a fourth drain bias voltage connector directly electrically connected to the third drain bias voltage connector.

6. The package of claim 4 further comprising:
   a first decoupling capacitor coupled between the first gate bias voltage connector and RF signal ground; and
   a second decoupling capacitor coupled between the first drain bias voltage connector and RF signal ground.

7. The package of claim 4 wherein
   the third gate bias voltage connector is directly electrically connected to the first gate bias voltage connector; and
   the third drain bias voltage connector is directly electrically connected to the first drain bias voltage connector.

8. The package of claim 7 further comprising:
   a first decoupling capacitor coupled between the first gate bias voltage connector and RF signal ground; and
   a second decoupling capacitor coupled between the first drain bias voltage connector and RF signal ground.

9. The package of claim 1, wherein:
   the first amplifier circuit comprises a first dual-stage amplifier comprising a first amplifier stage having source, gate, and drain terminals, and a second amplifier stage having source, gate, and drain terminals, wherein
      the source terminals of both amplifier stages are connected to RF signal ground;
      the gate terminal of the first amplifier stage is the gate terminal of the first amplifier circuit;
      the drain terminal of the first amplifier stage is connected to the gate terminal of the second amplifier stage; and
      the drain terminal of the second amplifier stage is the drain terminal of the first amplifier circuit;
   the first gate bias voltage connector is coupled to the gate terminal of one of the first and second amplifier stages of the first amplifier circuit; and
   the first drain bias voltage connector is coupled to the drain terminal of one of the first and second amplifier stages of the first amplifier circuit;
   a second gate bias voltage connector is coupled to the gate terminal of the other of the first and second amplifier stages of the first amplifier circuit; and
   a second drain bias voltage connector is coupled to the drain terminal of the other of the first and second amplifier stages of the first amplifier circuit.

10. The package of claim 9 wherein at least one of:
    the first and second gate bias voltage connectors are disposed on either side of the first RF input connector; and
    the first and second drain bias voltage connectors are disposed on either side of the first RF output connector.

11. The package of claim 9 further comprising:
    a second amplifier circuit having source, gate, and drain terminals, the source terminal connected to RF signal ground, wherein the second amplifier circuit comprises a second dual-stage amplifier comprising a first amplifier stage having source, gate, and drain terminals, and a second amplifier stage having source, gate, and drain terminals, wherein
       the source terminals of both amplifier stages are connected to RF signal ground;
       the gate terminal of the first amplifier stage is the gate terminal of the second amplifier circuit;
       the drain terminal of the second amplifier stage is the drain terminal of the second amplifier circuit; and
       the drain terminal of the first amplifier stage is connected to the gate terminal of the second amplifier stage;
    a second RF input connector connected to the second amplifier circuit gate terminal;
    a second RF output connector connected to the second amplifier circuit drain terminal;

a third gate bias voltage connector coupled to the gate terminal of one of the first and second amplifier stages of the second amplifier circuit;
a fourth gate bias voltage connector coupled to the gate terminal of the other of the first and second amplifier stages of the second amplifier circuit;
a third drain bias voltage connector coupled to the drain terminal of one of the first and second amplifier stages of the second amplifier circuit; and
a fourth drain bias voltage connector is coupled to the drain terminal of the other of the first and second amplifier stages of the second amplifier circuit.

12. The package of claim 11 wherein at least one of:
the third and fourth gate bias voltage connectors are disposed on either side of the second RF input connector; and
the third and fourth drain bias voltage connectors are disposed on either side of the second RF output connector.

13. A method of fabricating an electronic circuit package housing one or more amplifier circuits, comprising:
placing a first amplifier circuit having source, gate, and drain terminals, the source terminal connected to Radio Frequency (RF) signal ground;
directly electrically connecting a first RF input connector to the first amplifier circuit gate terminal;
directly electrically connecting a first RF output connector to the first amplifier circuit drain terminal;
coupling a first gate bias voltage connector to the gate terminal of the first amplifier circuit;
coupling a first drain bias voltage connector to the drain terminal of the first amplifier circuit; and
directly electrically connecting at least one of
a second gate bias voltage connector to the first gate bias voltage connector; and
a second drain bias voltage connector to the first drain bias voltage connector.

14. The method of claim 13 wherein the parallel connections of the first and second gate bias voltage connectors or drain bias voltage connectors reduce the effective respective gate or drain bias feed inductance, relative to one respective gate or drain bias voltage connector.

15. The method of claim 13, wherein either one or both of
the first and second gate bias voltage connectors are disposed on opposite sides of the first RF input connector; and
the first and second drain bias voltage connectors are disposed on opposite sides of the first RF output connector.

16. The method of claim 13, further comprising:
placing a second amplifier circuit having source, gate, and drain terminals, the source terminal connected to RF signal ground;
connecting a second RF input connector to the second amplifier circuit gate terminal;
connecting a second RF output connector to the second amplifier circuit drain terminal;
coupling a third gate bias voltage connector to the gate terminal of the second amplifier circuit; and
coupling a third drain bias voltage connector to the drain terminal of the second amplifier circuit.

17. The method of claim 16, further comprising at least one of
directly electrically connecting a fourth gate bias voltage connector to the third gate bias voltage connector; and
directly electrically connecting a fourth drain bias voltage connector to the third drain bias voltage connector.

18. The method of claim 16 further comprising:
coupling a first decoupling capacitor between the first gate bias voltage connector and RF signal ground; and
coupling a second decoupling capacitor between the first drain bias voltage connector and RF signal ground.

19. The method of claim 16 further comprising
directly electrically connecting the third gate bias voltage connector to the first gate bias voltage connector; and
directly electrically connecting the third drain bias voltage connector to the first drain bias voltage connector.

20. The method of claim 13, wherein:
the first amplifier circuit comprises a first dual-stage amplifier comprising a first amplifier stage having source, gate, and drain terminals, and a second amplifier stage having source, gate, and drain terminals, wherein
the source terminals of both amplifier stages are connected to RF signal ground;
the gate terminal of the first amplifier stage is the gate terminal of the first amplifier circuit;
the drain terminal of the first amplifier stage is connected to the gate terminal of the second amplifier stage; and
the drain terminal of the second amplifier stage is the drain terminal of the first amplifier circuit;
and further comprising:
coupling the first gate bias voltage connector to the gate terminal of one of the first and second amplifier stages of the first amplifier circuit;
coupling the first drain bias voltage connector to the drain terminal of one of the first and second amplifier stages of the first amplifier circuit;
coupling a second gate bias voltage connector to the gate terminal of the other of the first and second amplifier stages of the first amplifier circuit; and
coupling a second drain bias voltage connector to the drain terminal of the other of the first and second amplifier stages of the first amplifier circuit.

21. The method of claim 20 wherein at least one of:
the first and second gate bias voltage connectors are disposed on either side of the first RF input connector; and
the first and second drain bias voltage connectors are disposed on either side of the first RF output connector.

22. The method of claim 20 further comprising:
placing a second amplifier circuit having source, gate, and drain terminals, the source terminal connected to RF signal ground, wherein the second amplifier circuit comprises a second dual-stage amplifier comprising a first amplifier stage having source, gate, and drain terminals, and a second amplifier stage having source, gate, and drain terminals, wherein
the source terminals of both amplifier stages are connected to RF signal ground;
the gate terminal of the first amplifier stage is the gate terminal of the second amplifier circuit;
the drain terminal of the second amplifier stage is the drain terminal of the second amplifier circuit; and
the drain terminal of the first amplifier stage is connected to the gate terminal of the second amplifier stage;
connecting a second RF input connector to the second amplifier circuit gate terminal;
connecting a second RF output connector to the second amplifier circuit drain terminal;

coupling a third gate bias voltage connector to the gate terminal of one of the first and second amplifier stages of the second amplifier circuit;

coupling a fourth gate bias voltage connector to the gate terminal of the other of the first and second amplifier stages of the second amplifier circuit;

coupling a third drain bias voltage connector to the drain terminal of one of the first and second amplifier stages of the second amplifier circuit; and coupling a fourth drain bias voltage connector is to the drain terminal of the other of the first and second amplifier stages of the second amplifier circuit.

23. The method of claim 22 wherein at least one of:

the third and fourth gate bias voltage connectors are disposed on either side of the second RF input connector; and the third and fourth drain bias voltage connectors are disposed on either side of the second RF output connector.

* * * * *